United States Patent
Marsh et al.

(10) Patent No.: US 8,624,225 B2
(45) Date of Patent: Jan. 7, 2014

(54) METHODS OF FORMING STRUCTURES HAVING NANOTUBES EXTENDING BETWEEN OPPOSING ELECTRODES AND STRUCTURES INCLUDING SAME

(75) Inventors: Eugene P. Marsh, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/528,342

(22) Filed: Jun. 20, 2012

(65) Prior Publication Data

US 2012/0261647 A1    Oct. 18, 2012

Related U.S. Application Data

(62) Division of application No. 12/176,013, filed on Jul. 18, 2008, now Pat. No. 8,222,127.

(51) Int. Cl.
*H01L 21/20* (2006.01)
*H01L 29/775* (2006.01)
*B82Y 40/00* (2011.01)
*B82Y 99/00* (2011.01)

(52) U.S. Cl.
USPC .............. 257/29; 438/478; 977/742; 977/842

(58) Field of Classification Search
CPC ...... H01L 21/20; H01L 29/775; B82Y 40/00; B82Y 99/00
USPC ............... 257/29, E29.245, E21.09; 438/478; 977/742, 842
See application file for complete search history.

(56) References Cited

U.S. PATENT DOCUMENTS 6,297,063 B1    10/2001  Brown et al.
(Continued)

FOREIGN PATENT DOCUMENTS

WO    0103208 A1    1/2001
WO    2005089465 A2    9/2005

OTHER PUBLICATIONS

Amlani et al., Field-Effect and Single-Electron Transistors Based on Single-Walled Carbon Nanotubes Catalyzed by Al/Ni Thin Films, IEEE Transactions on Nanotechnology, vol. 3, No. 1, Mar. 2004, pp. 202-209.
Cha et al., Fabrication of a nanoelectromechanical switch using a suspended carbon nanotube, Applied Physics Letters, vol. 86, 2005, pp. 083105-1-083105-3.
Collins et al., Nanotube nanodevice, Science, vol. 278, Issue 5335, Oct. 3, 1997, 10 pages.

(Continued)

*Primary Examiner* — Walter H Swanson
(74) *Attorney, Agent, or Firm* — TraskBritt

(57) ABSTRACT

A semiconductor structure including nanotubes forming an electrical connection between electrodes is disclosed. The semiconductor structure may include an open volume defined by a lower surface of an electrically insulative material and sidewalls of at least a portion of each of a dielectric material and opposing electrodes. The nanotubes may extend between the opposing electrodes, forming a physical and electrical connection therebetween. The nanotubes may be encapsulated within the open volume in the semiconductor structure. A semiconductor structure including nanotubes forming an electrical connection between source and drain regions is also disclosed. The semiconductor structure may include at least one semiconducting carbon nanotube electrically connected to a source and a drain, a dielectric material disposed over the at least one semiconducting carbon nanotube and a gate dielectric overlying a portion of the dielectric material. Methods of forming the semiconductor structures are also disclosed.

17 Claims, 5 Drawing Sheets

(56) References Cited

U.S. PATENT DOCUMENTS

| | | |
|---|---|---|
| 6,620,703 B2 | 9/2003 | Kunikiyo |
| 6,942,921 B2 | 9/2005 | Rueckes et al. |
| 6,990,009 B2 | 1/2006 | Bertin et al. |
| 7,012,362 B2 | 3/2006 | Kawate et al. |
| 7,087,920 B1 | 8/2006 | Kamins |
| 7,269,052 B2 | 9/2007 | Segal et al. |
| 7,271,071 B2 | 9/2007 | Marsh |
| 7,301,802 B2 | 11/2007 | Bertin et al. |
| 7,304,357 B2 | 12/2007 | Jaiprakash et al. |
| 7,329,931 B2 | 2/2008 | Bertin |
| 7,330,709 B2 | 2/2008 | Bertin |
| 2006/0233694 A1 | 10/2006 | Sandhu et al. |
| 2007/0015303 A1 | 1/2007 | Bertin et al. |
| 2007/0041886 A1 | 2/2007 | Ishida et al. |
| 2007/0092989 A1 | 4/2007 | Kraus et al. |
| 2007/0121364 A1 | 5/2007 | Bertin et al. |
| 2007/0158766 A1 | 7/2007 | Lieber et al. |
| 2007/0272951 A1 | 11/2007 | Lieber et al. |
| 2007/0281156 A1 | 12/2007 | Lieber et al. |
| 2008/0012047 A1 | 1/2008 | Bertin et al. |
| 2008/0087102 A1 | 4/2008 | Snell et al. |
| 2009/0057650 A1 | 3/2009 | Lieber et al. |
| 2010/0029063 A1 | 2/2010 | Gambin et al. |
| 2010/0108988 A1* | 5/2010 | Grebel et al. .................. 257/24 |
| 2010/0133512 A1* | 6/2010 | Parikh et al. ................... 257/24 |

OTHER PUBLICATIONS

Guo et al., Catalytic growth of single-walled nanotubes by laser vaporization, Chemical Physics Letters, vol. 243 (1995) pp. 49-54.

Homma et al., Growth of suspended carbon nanotube networks on 100-nm-scale silicon pillars, Applied Physics Letters, vol. 81, No. 12 (2002), pp. 2261-2263.

Huang et al., Growth of large periodic arrays of carbon nanotubes, Applied Physics Letters, vol. 82, No. 3, Jan. 20, 2003, pp. 460-462.

Jang et al., Nanoelectromechanical switches with vertically aligned carbon nanotubes, Applied Physics Letters, vol. 87 (2005), pp. 163114-1-163114-3.

Khakani et al., Localized Growth of Suspended SWCNTs by Means of an "All-Laser" Process and Their Direct Integration Into Nanoelectronic Devices, IEEE Transactions on Nanotechnology, vol. 5, No. 3, May 2006, pp. 237-242.

Lu et al., Self-Assembly for Semiconductor Industry, IEEE Transactions on Semiconductor Manufacturing, vol. 20, No. 4, Nov. 2007, pp. 421-431.

Rueckes et al., Carbon Nanotube-Based Nonvolatile Random Access Memory for Molecular Computing, Science, vol. 289 (2000), pp. 94-97.

Tans et al., Room-temperature transistor based on a single carbon nanotube, Letters to Nature, vol. 393, pp. 49-52, May 7, 1998.

* cited by examiner

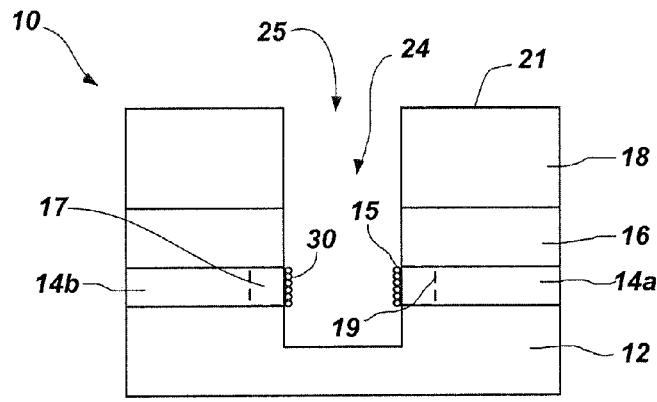
*FIG. 3B*
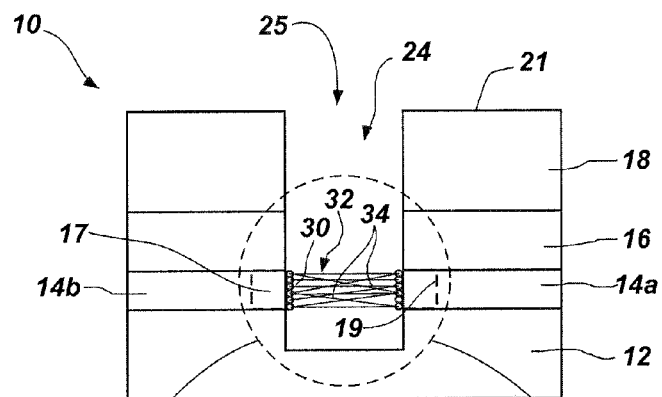
*FIG. 4A*
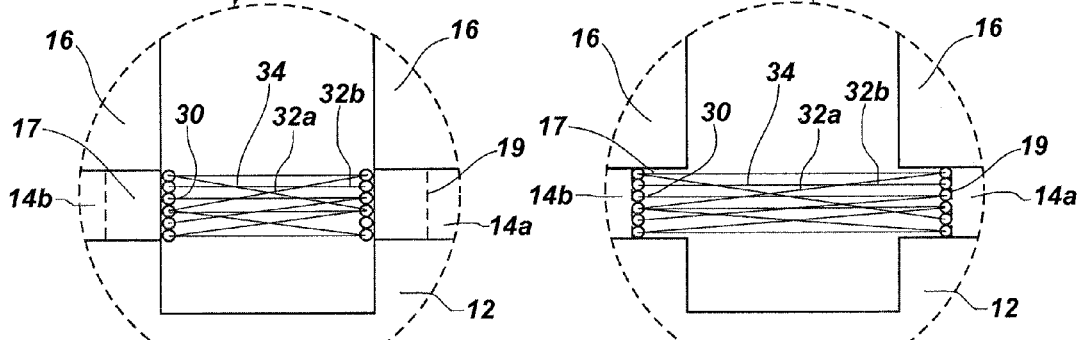
*FIG. 4B*     *FIG. 4C*

METHODS OF FORMING STRUCTURES HAVING NANOTUBES EXTENDING BETWEEN OPPOSING ELECTRODES AND STRUCTURES INCLUDING SAME

CROSS-REFERENCE TO RELATED APPLICATION

This application is a divisional of U.S. patent application Ser. No. 12/176,013, filed Jul. 18, 2008, now U.S. Patent No. 8,222,127, issued Jul. 17, 2012, the disclosure of which is hereby incorporated herein by this reference in its entirety.

TECHNICAL FIELD

Embodiments of the invention relate to methods of forming structures and, more specifically, to methods of forming switching elements and transistor devices including control structures including a nanotube component.

BACKGROUND

Fabricating nano-scale devices that function as ohmic contacts and have low resistance has been a challenge to the semiconductor industry. Conventional low resistance ohmic contacts are made of metal suicides formed on heavily doped semiconductor regions. The contact resistance is inversely proportional to contact area. In nano-scale devices, the contact area is on the order of nanometer or smaller and, thus, contact resistance limits performance.

Carbon nanotube structures are finding their way into nano-scale devices due to their unique electron transport properties. The carbon nanotubes may be metallic or semiconductive. Carbon nanotubes have high current densities, such as up to about $10^9$ A/cm$^2$. This and other properties of the carbon nanotubes make them ideal candidates for use in molecular-scale electronic devices. Due to their low dimensionality, structural symmetry and electronic properties, carbon nanotubes are being explored for use in transistors, interconnects and switches for non-volatile memory applications.

Integrated circuits combining carbon nanotubes with a silicon metal-oxide semiconductor field-effect transistor (MOSFET) switching circuit have been formed by growing the carbon nanotubes onto the integrated circuit at predefined locations. Conventionally, the carbon nanotubes are positioned on gate oxides and contacted by polycrystalline thin film metal electrodes or are overgrown epitaxially by high-k dielectrics using atomic layer deposition.

Presently, the manufacturing of carbon nanotube memory devices depends on a so-called "top-down" fabrication technique. For example, a film including a monolayer of nanotubes is deposited on an electrically conductive material using a spin-on technique and is lithographically patterned to make columns and rows of the nanotubes. The 1 nm to 2 nm-thick, patterned nanotube is interconnected with complementary metal-oxide semiconductor (CMOS) circuitry.

Semiconductor structures have also been formed including so-called "ribbons" of carbon nanotubes that are suspended over a carbon substrate. In the "off" state, the ribbon of carbon nanotubes does not touch the carbon substrate, and electricity does not flow between an interconnect suspending the ribbon. In the "on" state, the carbon nanotubes bend downward and adhere to the carbon substrate through van der Waals forces, enabling electricity to flow between the interconnect. However, bit failure is a common occurrence with the above-mentioned techniques because reliable contact between electrodes and the carbon nanotubes has not been achieved.

Semiconductor structures with improved control structures are desired, as are methods of forming such semiconductor structures.

BRIEF DESCRIPTION OF THE SEVERAL VIEWS OF THE DRAWINGS

FIGS. 1-4A are cross-sectional views of embodiments of semiconductor structures of the invention during various stages of fabrication;

FIGS. 4B and 4C are exploded views, each illustrating a portion of the semiconductor structure shown in FIG. 4A;

DETAILED DESCRIPTION

Methods of fabricating structures including nanotubes are disclosed, as are structures including the nanotubes. The structures have improved electrical contact between the nanotubes and electrodes relative to that offered by conventional nanoscale structures.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The drawings presented herein are not necessarily drawn to scale and are not actual views of a particular semiconductor structure or fabrication process thereof, but are merely idealized representations that are employed to describe the embodiments of the invention. Additionally, elements common between drawings may retain the same numerical designation.

The following description provides specific details, such as material types, material thicknesses, and processing conditions in order to provide a thorough description of embodiments of the invention. However, a person of ordinary skill in the art would understand that the embodiments of the invention may be practiced without employing these specific details. Indeed, the embodiments of the invention may be practiced in conjunction with conventional semiconductor fabrication techniques employed in the industry. In addition, the description provided below does not form a complete process flow for manufacturing a semiconductor device in which the semiconductor structure is present, and the semiconductor devices described below do not form a complete electronic device. Only those process acts and semiconductor structures or semiconductor devices necessary to understand the embodiments of the invention are described in detail below. Additional processing acts to form a complete semiconductor device from the semiconductor structures or to form a complete electronic device from the semiconductor device may be performed by conventional fabrication techniques, which are not described herein.

The materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. While the materials may be formed as layers, the materials are not limited thereto and may be formed in other configurations.

Figure 1:
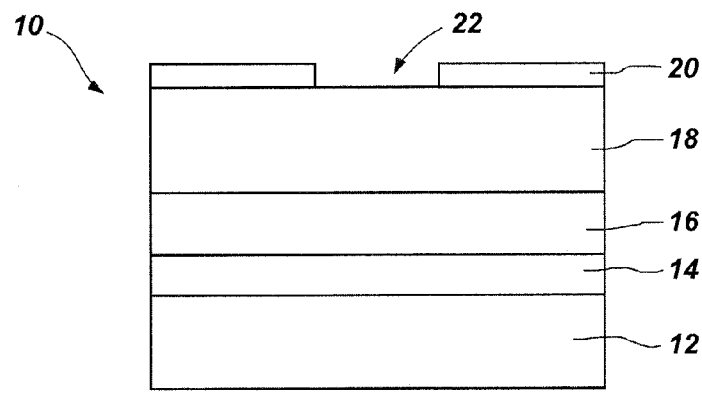

FIG. 1 shows a semiconductor structure 10 that includes an electrically insulative material 12, an electrode material 14, a dielectric material 16, a flowable material 18 and a mask material 20. The electrode material 14 may be formed over and in contact with the electrically insulative material 12, the dielectric material 16 may be formed over and in contact with the electrode material 14, the flowable material 18 may be formed over and in contact with the dielectric material 16, and the mask material 20 may be formed over and in contact with the flowable material 18. The electrically insulative material 12, the electrode material 14, the dielectric material 16 and the flowable material 18 may be formed by conventional techniques, which are not described in detail herein. For example, the electrically insulative material 12 may have a thickness of less than or equal to about 500 Å and may be formed from a dielectric material such as silicon dioxide ("$SiO_2$"). In some embodiments, the electrically insulative material 12 may be deposited over a substrate (not shown) by conventional techniques, which are not described in detail herein. As used herein, the term "substrate" means and includes a base material or construction upon which materials, such as the electrically insulative material 12 and electrode material 14, are deposited. The substrate may be a semiconductor substrate, a base semiconductor layer on a supporting structure, a metal electrode or a semiconductor substrate having one or more layers, structures or regions formed thereon. The substrate may include, for example, silicon-on-insulator (SOI) type substrates, silicon-on-sapphire (SOS) type substrates, and epitaxial layers of silicon supported by a layer of base material. Semiconductor type materials may be doped or undoped.

By way of non-limiting example, the electrode material 14 may have a thickness in a range of from about 10 Å to about 1000 Å and may be formed from a conductive material, such as a transition metal, a conductive metal oxide, or a metal carbide. More specifically, the electrode material 14 may include tungsten, hafnium, zirconium, titanium, tantalum, aluminum, ruthenium, palladium, platinum, cobalt, nickel, combinations thereof, or an alloy thereof. The electrode material 14 may be deposited over the electrically insulative material 12 by conventional techniques such as, for example, electroless deposition, PVD, and CVD. The dielectric material 16 may have a thickness in a range of from about 10 Å to about 1000 Å and may be an oxide material, a nitride material or a polysilicon material. In one embodiment, the dielectric material 16 is silicon dioxide. The dielectric material 16 may be deposited over the electrode material 14 by conventional techniques, which are not described in detail herein.

The flowable material 18 may have a thickness in a range of from about 100 Å to about 5000 Å and may be deposited over and in contact with the dielectric material 16. As used herein, the term "flowable material" means and includes a material capable of flowing when heated to a sufficient temperature. For example, the flowable material 18 may be a material that, when heated, forms a viscous liquid or semi-solid material. The flowable material 18 may be a non-reactive, non-conductive material and may provide a barrier to moisture. By way of non-limiting example, the flowable material 18 may be a glass, such as a borophosphosilicate glass (BPSG), a phosphosilicate glass (PSG) or a spin-on glass (SOG). Alternatively, the flowable material 18 may be a polymer or a polyimide. In one embodiment, the flowable material 18 is BPSG. The flowable material 18 may be distributed on the surface of the dielectric material 16 by conventional processes, such as by spin-coating.

The mask material 20 may be a positive or negative photoresist material or a hardmask material, such as transparent carbon or amorphous carbon. Such photoresist and hardmask materials are known in the art and, therefore, are not described in detail herein. The mask material 20 is illustrated in FIG. 1 as being patterned. The mask material 20 may be deposited on the flowable material 18, and may be patterned and developed to form an aperture 22 exposing a region of the underlying flowable material 18. Photoresist materials and photolithographic techniques are well known in the art and, therefore, selecting, depositing, patterning and developing the photoresist material are not discussed in detail herein.

Figure 2:
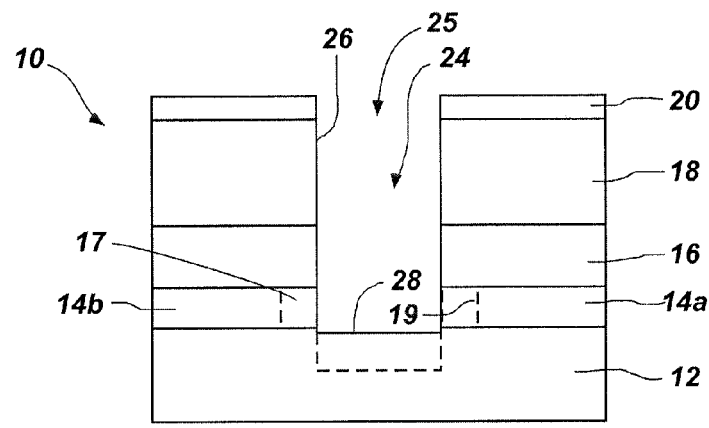

FIG. 2 shows the semiconductor structure 10 including a recess 24 extending through the flowable material 18, the dielectric material 16 and the electrode material 14. Forming the recess 24 produces electrodes 14a and 14b. The recess 24 is defined by a lower surface 28 of the electrically insulative material 12 and sidewalls 26 of at least the flowable material 18, the dielectric material 16 and the electrode material 14. The recess 24 may have a width in a range of from about 10 nm to about 0.1 µm. By way of non-limiting example, the recess 24 may be a two-dimensional structure, such as a container (not shown) having a generally cylindrical interior, or may be a trench-like structure. More specifically, the recess 24 may be a cylindrical capacitor container structure. The lower surface 28 of the recess 24 may correspond to an upper surface of the electrically insulative material 12. A mouth 25 of the recess 24 may be positioned at an opposite end from the lower surface 28 of the recess 24. In some embodiments, the electrode material 14 may be further removed to form a cavity 17, which is shown in broken lines. The cavity 17 may be formed using a selective etching process that removes the electrode material 14 at a faster rate than the electrically insulative material 12, the dielectric material 16, and the flowable material 18. By way of non-limiting example, if the electrode material 14 is tungsten, the electrically insulative material 12 is polysilicon, the dielectric material 16 is silicon dioxide, and the flowable material 18 is BPSG, a wet etchant including ethylenediaminetetraacetic acid (EDTA) and hydrogen peroxide ($H_2O_2$) may be applied at a temperature of about 65° C. to form the cavity 17.

For the sake of clarity, the semiconductor structure 10 depicted in the following drawings includes one recess 24. In other embodiments, a plurality of recesses 24 may be formed in the semiconductor structure 10. To form the recess 24, a portion of each of the flowable material 18, the dielectric material 16 and the electrode material 14 underlying the aperture 22 (shown in FIG. 1) may be removed. Portions of the flowable material 18, the dielectric material 16 and the electrode material 14 may be removed using a single etch chemistry, or separate etch chemistries may be used to remove each of these materials. The etch chemistries may be selected by a person of ordinary skill in the art based on the materials used as the flowable material 18, the dielectric material 16 and the electrode material 14.

As a non-limiting example, if the flowable material 18 is BPSG, a dry (i.e., plasma) etching process using tetrafluoromethane ($CF_4$) or trifluoromethane ($CHF_3$) may be used to remove the portion of the flowable material 18 exposed through the mask material 20, forming the mouth 25 of the recess 24. If the dielectric material 16 is silicon dioxide, a dry (i.e., plasma) etching process using tetrafluoromethane ($CF_4$) or trifluoromethane ($CHF_3$) may be used to remove the exposed portion of the dielectric material 16. If the electrode material 14 is formed from a transition metal, the exposed portion may be removed using, for example, a carbon monoxide-based plasma etch or a hydrogen chloride and argon plasma etch, to form electrodes 14a and 14b. Removing the electrode material 14 may expose at least a portion of the underlying electrically insulative material 12. As shown by the dashed line in FIG. 2, the recess 24 may, optionally, extend at least partially into the electrically insulative material 12.

While subsequent drawings illustrate the recess 24 as extending at least partially into the electrically insulative material 12, the recess 24 may terminate at the upper surface of the electrically insulative material 12. By way of non-limiting example, if the electrically insulative material 12 is silicon dioxide, the exposed portion of the electrically insulative material 12 may be removed using a buffered HF solution to extend the recess 24 at least partially into the electrically insulative material 12. The sidewalls 26 of the recess 24 include opposing, exposed vertical regions of the flowable material 18, the dielectric material 16 and the electrodes 14a and 14b. The exposed vertical regions of the flowable material 18, the dielectric material 16 and the electrodes 14a and 14b on opposing sides of the recess 24 may be contiguous. Alternatively, the sidewalls 26 include exposed vertical regions of the electrically insulative material 12. The exposed vertical regions of the electrically insulative material 12 within the recess 24 may oppose one another at contiguous regions within the recess 24. The lower surface 28 of the recess 24 may be defined by an exposed portion of the electrically insulative material 12.

Figure 3A:
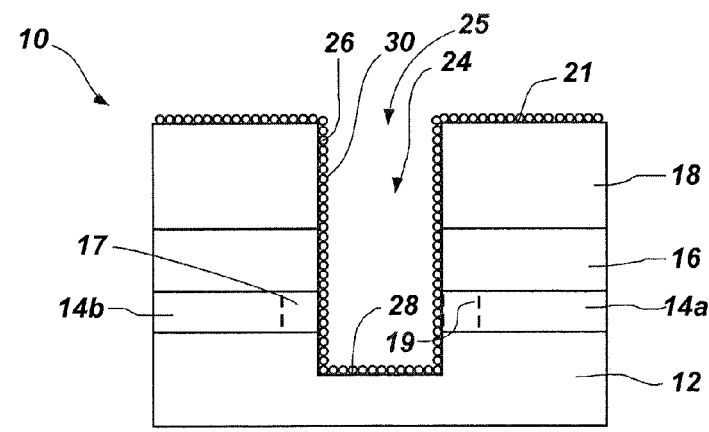

Referring to FIGS. 3A and 3B, after formation of the recess 24, the mask material 20 may be removed to expose an upper surface 21 of the flowable material 18. By way of non-limiting example, if the mask material 20 is a photoresist material, the photoresist material may be removed using a conventional masking process. Alternatively, the mask material 20 may be removed after removing a portion of the flowable material 18 when forming recess 24 such that the remaining portions of the flowable material 18 are used as a mask to extend the recess 24 into underlying dielectric material 16 and the electrode material 14.

As shown in FIG. 3A, a catalyst 30 may be deposited on the sidewalls 26 of the recess 24. The catalyst 30 may be a material suitable for catalyzing the growth of carbon nanotubes. As a non-limiting example, the catalyst 30 may be a transition metal, such as nickel, cobalt, iron, platinum, palladium, copper, vanadium, molybdenum, zinc, an oxide of a transition metal and combinations or alloys thereof. The catalyst 30 may be deposited on the sidewalls 26 of the recess 24 by electroless deposition, spray deposition, photocatalytic deposition, electrochemical deposition, chemical vapor deposition, or any other method suitable for depositing the catalyst 30. In one embodiment, the catalyst 30 is a transition metal capable of being deposited electrolessly. The catalyst 30 may be deposited substantially continuously over the lower surface 28 and the sidewalls 26 of the recess 24, as shown in FIG. 3A.

Additionally, nanodots (not shown) including a transition metal, such as nickel, cobalt, iron, platinum, palladium, copper, vanadium, molybdenum, zinc, a transition metal oxide, or any combination or alloy thereof, may used as the catalyst 30. The nanodots may be deposited as a discontinuous layer having a thickness in a range of from about 2 nm to about 8 nm, and may include particles having an average diameter in a range of from about 1 nm to about 10 nm. Conventional methods including, but not limited to, plasma enhanced CVD (PECVD) or plasma enhanced ALD (PEALD), may be used to deposit the nanodots on the sidewalls 26 of the recess 24.

The catalyst 30 located on each of the flowable material 18, the dielectric material 16 and the electrically insulative material 12 may be selectively removed so that the catalyst 30 remains only on sidewalls 15 of the electrodes 14a and 14b within the recess 24, as shown in FIG. 3B. By way of non-limiting example, if the flowable material 18 is BPSG and both the dielectric material 16 and the electrically insulative material 12 are $SiO_2$, an etch chemistry selective for oxides may be used to remove the catalyst 30 from the BPSG and the $SiO_2$. By way of non-limiting example, a solution including dilute HF may be used to remove exposed portions of the flowable material 18, the dielectric material 16 and the electrically insulative material 12. By removing the exposed portions of the flowable material 18, the dielectric material 16 and the electrically insulative material 12, as shown in broken lines, the catalyst 30 deposited on these materials may be removed without removing the catalyst 30 deposited on the sidewalls 15 of the electrodes 14a and 14b to produce the semiconductor structure 10 shown in FIG. 3B.

In some embodiments, the semiconductor structure 10 includes a cavity 17 having surfaces 19 shown in dashed lines of the electrodes 14a and 14b exposed within the recess 24. The catalyst 30 may be deposited on the sidewalls 26 of the recess 24 as well as on the surfaces 19 of the electrode material 14. A protective material (not shown) may be applied over the sidewalls 26 of the recess 24 and within the cavity 17. Deposition of the catalyst 30 may be followed by a conventional spacer etch to remove the catalyst 30 from the sidewalls 26 of the recess 24 and the upper surface 21 of the flowable material 18 without removing the catalyst 30 from the surfaces 19 of the cavity 17. The protective material may then be removed selective to the catalyst 30 to form the semiconductor structure 10 shown in FIG. 3B.

The semiconductor structure 10 shown in FIG. 3B may, alternatively, be formed by selectively depositing the catalyst 30 on the sidewalls 15 of the electrodes 14a and 14b using, for example, an electroless deposition process. The catalyst 30 may be selectively deposited on the sidewalls 15 of the electrodes 14a and 14b while exposed portions of the flowable material 18, the dielectric material 16 and the electrically insulative material 12 within the recess 24 remain substantially free of the catalyst 30.

FIG. 4A shows the semiconductor structure 10 after formation of nanotubes 32 within the recess 24. As used herein, the term "nanotubes" means and includes any hollow carbon cylinders or graphene cylinders, such as single-walled nanotubes (SWNTs) and multi-walled nanotubes (MWNTs). A plurality of nanotubes 32 may be formed on the catalyst 30 within the recess 24 by conventional techniques including, but not limited to, CVD, arc discharge, and laser vaporization. As a non-limiting example, to initiate formation of the nanotubes 32, the catalyst 30 on the sidewalls 15 of the electrodes 14a and 14b may be exposed to, or contacted with, a process gas. The process gas may be a gaseous precursor including a carbon-containing gas or a mixture of the carbon-containing gas and an inert gas. Non-limiting examples of carbon-containing gases include aliphatic hydrocarbons, both saturated and unsaturated, such as methane, ethane, propane, butane, hexane, ethylene, propylene and combinations thereof; carbon monoxide; oxygenated hydrocarbons, such as acetone, acetylene, methanol and combinations thereof; and aromatic hydrocarbons, such as toluene, benzene, naphthalene and combinations thereof. In addition, combinations of the above-mentioned carbon-containing gases may be used. More specifically, the carbon-containing gas may be methane, carbon monoxide, acetylene, ethylene or ethanol. Inert gases, such as nitrogen, helium, hydrogen, ammonia or combinations thereof, may be used in the process gas.

4process gas in a reaction chamber (not shown). The reaction chamber may be, for example, an inductively coupled plasma chamber, a capacitatively coupled plasma chamber, a vacuum chamber, a microwave plasma chamber, or any other chamber capable of generating high-density plasma. The process gas may enter the reaction chamber at a flow rate in a range of from about 50 cm$^3$/minute to about 2000 cm$^3$/minute, a pressure in a range of from about 150 torr to about 550 torr and a temperature in a range of from about 700° C. to about 1200° C. For example, if cobalt particles are used as the catalyst 30, nanotubes 32 may be formed by exposing the cobalt particles to methane gas at a pressure of about 500 torr and a temperature of about 950° C. As another example, if the catalyst 30 includes iron particles, the nanotubes 32 may be formed by exposing the iron particles to methane gas at a pressure of about 200 torr and a temperature of about 800° C.

Once formation of the nanotubes 32 has been initiated on the catalyst 30, the nanotubes 32 self-assemble in the presence of the gaseous precursor. The nanotubes 32 may have a diameter in a range of from about 1 nm to about 10 nm and a length in a range of from about 10 nm to about 0.1 µm. The nanotubes 32 may be grown so that a so-called "bridge" is formed between the particles of the catalyst 30 on opposing electrodes 14a and 14b.

The nanotubes 32 may extend from the particles of catalyst 30 towards particles of catalyst 30 on the opposite electrode, providing an electrical connection between the electrodes 14a and 14b. In other words, the nanotubes 32 may form an interconnect between the electrodes 14a and 14b on opposing sides of the recess 24. As used herein, the term "interconnect" means and includes a structure or structures that enable communication of an electrical signal between the electrodes 14a and 14b. The interconnect may be a path through which data is transmitted, such as an electrically conductive bridge. The interconnect may be associated with, for example, an interface or connection between transistors on a semiconductor die. By growing the nanotubes 32 in situ, electrical contact between the electrodes 14a and 14b may be substantially improved because terminal ends of the nanotubes 32 may be embedded on the surface of, and between, particles of the catalyst 30. In contrast, conventional techniques for fanning nanotubes provide only physical contact between the nanotubes and the electrodes. In addition, growing the nanotubes 32 in situ provides improved distribution of the nanotubes 32 at the electrodes 14a and 14b than conventional techniques of spinning on or spraying the nanotubes.

As shown in FIG. 4B, during formation, the nanotubes 32 may cross over or connect with one another to form at least one junction 34. Nanotubes 32a and 32b may come into contact with one another at the junction 34. As used herein, the term "contact" means and includes electrical contact, in which there is a conductive pathway between the nanotubes 32a and 32b. The crossed nanotubes 32a and 32b and the junction 34 may provide a memory element able to be switched between at least two readable states. Alternatively, a bias may be applied to the nanotubes 32 after formation to separate the nanotubes 32a and 32b eliminating the junction 34. As shown in FIG. 4C, the nanotubes 32 may be formed to extend between surfaces 19 of the electrodes 14a and 14b within the cavity 17.

Figure 5:
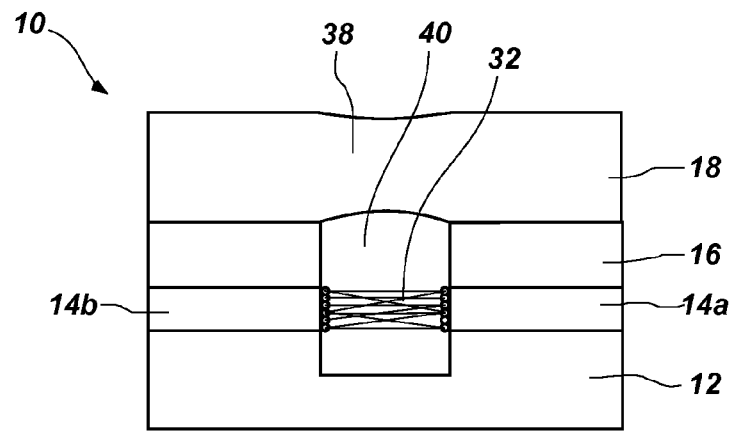
FIGS. 5-8 are cross-sectional views of embodiments of semiconductor structures of the invention during various stages of fabrication.
Figure 6:
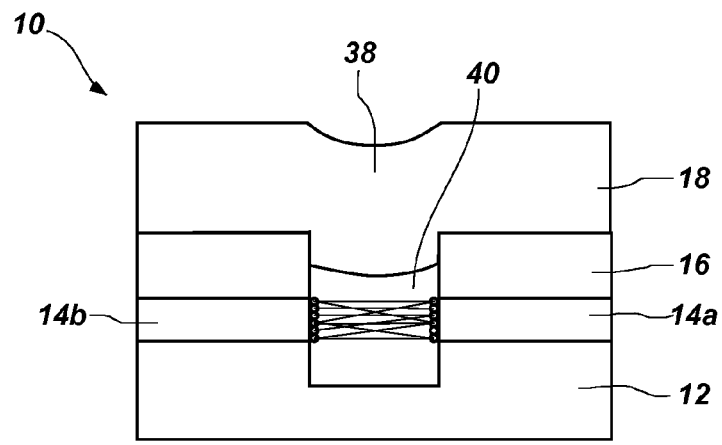

Referring to FIG. 5, the flowable material 18 may be reflowed to form an encapsulating element 38 that covers the mouth 25 of the recess 24 (shown in FIG. 2), forming an open volume 40 in the recess 24. The encapsulating element 38 may span or connect the opposing sidewalls 26 of the recess 24. Alternatively, the flowable material 18 may be reflowed such that the encapsulating element 38 connects the opposing sidewalls 26 of the recess 24 and at least partially fills the recess 24 while maintaining at least a portion of the open volume 40. The encapsulating element 38 may be formed by applying sufficient heat to convert the flowable material 18 to a semi-solid or liquid state. For example, if the flowable material 18 is a polymer material, it may be heated to a temperature in a range of from about 150° C. to about 350° C., so that the polymer material flows across the mouth 25 of the recess 24 forming the encapsulating element 38. The nanotubes 32 may be stable at a temperature used to reflow the flowable material 18. Since nanotubes 32 are thermally stable up to a temperature of about 2500° C. in a vacuum, the nanotubes 32 are capable of withstanding the process conditions used to reflow the flowable material 18. As a non-limiting example, if the flowable material is BPSG, the BPSG may be heated to a temperature of about 600° C. such that the BPSG is present in a semi-solid or liquid state. Once heated, the flowable material 18 may cover the mouth 25 of the recess 24 (shown in FIG. 2) or may flow into and partially fill the mouth 25 of the recess 24, such as at least a portion of the recess 24 between opposing sidewalls of the flowable material 18. However, at least a portion of the recess 24 may remain substantially unfilled, maintaining the open volume 40 around the nanotubes 32. As the flowable material 18 cools, the flowable material 18 may fuse or consolidate into a substantially continuous material over the dielectric material 16 and the open volume 40, thus forming the encapsulating element 38. The encapsulating element 38 may form a moisture-resistant barrier that encloses the nanotubes 32 within the open volume 40 in the semiconductor structure 10. By encapsulating the nanotubes 32 within the open volume 40, the nanotubes 32 may be protected while maintaining a free space around the nanotubes 32. Additionally, the flowable material 18 may be heated to backfill at least a portion of the open volume 40, reducing the volume of the open volume 40 surrounding the nanotubes 32, as shown in FIG. 6.

Figure 7:
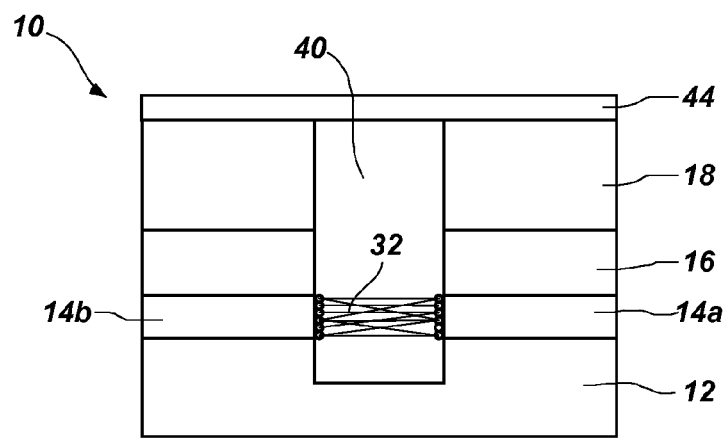
Figure 8:
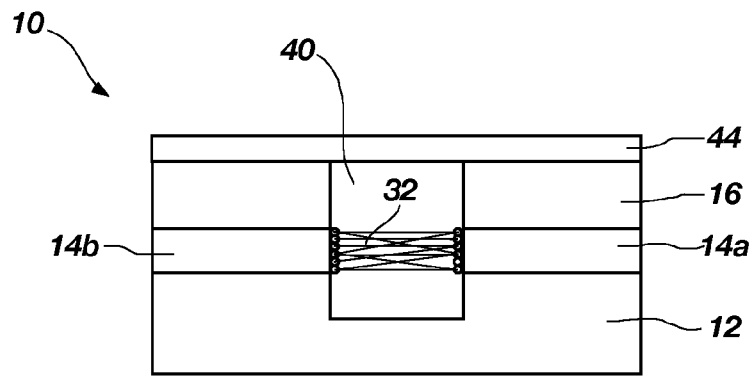

In another embodiment, a sealing material may be applied over and in contact with the flowable material 18 to cover at least the mouth 25 of the recess 24 (shown in FIG. 2), encapsulating the nanotubes 32 and forming the open volume 40. The sealing material may bridge or connect the opposing sidewalls 26 of the recess 24. By way of non-limiting example, the sealing material may be a preformed film 44 that may be adhered or otherwise secured to the flowable material 18, as shown in FIG. 7. As a non-limiting example, the preformed film 44 may include a dielectric protective material, such as a polyimide or BPSG. Additionally, as shown in FIG. 8, the sealing material, such as the preformed film 44, may be used in place of the flowable material 18 and may be applied over and in contact with the dielectric material 16 to cover at least the mouth 25 of the recess 24 (shown in FIG. 2). The preformed film 44 may be at least partially fused to the underlying flowable material 18 or to the underlying dielectric material 16. The sealing material may also be applied by spin-coating, spray-coating, dip-coating or other conventional techniques. By way of non-limiting example, the sealing material may be spin-coated or sprayed over the flowable material 18 such that a meniscus (not shown) of the sealing material bridges the mouth 25 of the recess 24, forming the open volume 40 and encapsulating the nanotubes 32.

The semiconductor structure 10 may function as an electronic memory element in which electrical connection between electrodes 14a and 14b is established by the nanotubes 32. By providing an electrical connection between the electrodes 14a and 14b, the nanotubes 32 may provide the basis for an electromechanical switching device. The nanotubes 32 may serve as the memory elements of the electromechanical switching device and as elements for switching between a stable conducting ("on") state and an open ("off") state. For example, the electrodes 14a and 14b may be source and drain electrodes and the nanotubes 32 may be suspended therebetween. The electrodes 14a and 14b may be operably coupled to a voltage source and ground so that a current is passed between the electrodes 14a and 14b by the nanotubes 32. Switching between the on and off states may be performed by applying a voltage across the nanotubes 32. The voltage may be applied to the nanotubes 32, for example, through the electrodes 14a and 14b. By way of non-limiting example, a voltage in a range of from about 0.5 volt to about 5 volts may be applied between the electrodes 14a and 14b. When a sufficient voltage is applied, the semiconductor structure 10 remains in the on state. The semiconductor structure 10 may be switched to the off state by a change in the voltage applied. For example, the crossed nanotubes 32a and 32b which intersect at the junction 34 may be cut or disconnected by applying a sufficient bias to the nanotubes 32. The nanotubes 32 may be switched between on and off states by alternatively biasing the nanotubes 32 or by biasing the nanotubes 32 at the junction 34. The application of a current may induce the nanotubes 32a and 32b to deform and connect such that the electromechanical switching device is in the on state. When the current flow is restricted, the nanotubes 32a and 32b disconnect such that the electromechanical switching device is in the off state.

Figure 9:
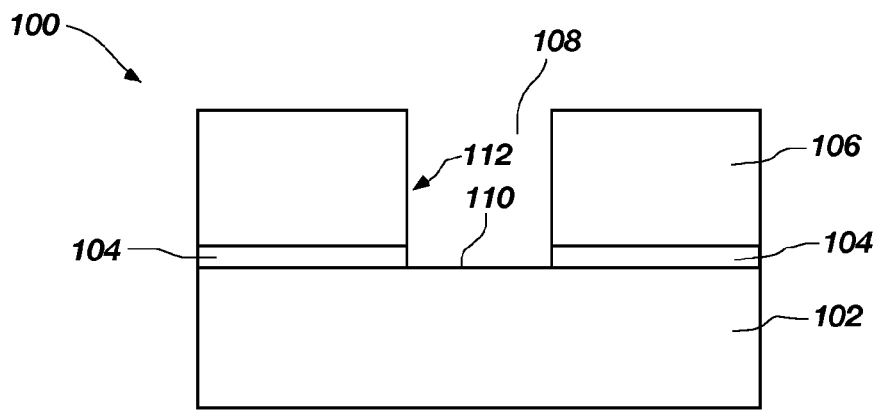
FIGS. 9-13 are cross-sectional views of another embodiment of semiconductor structures of the invention during various stages of fabrication.

FIG. 9 shows another embodiment of a semiconductor structure 100 that includes a recess 108 formed through an electrode material 104 and a dielectric material 106 overlying an electrically insulative material 102. The electrode material 104 may be formed over and in contact with the electrically insulative material 102; the dielectric material 106 may be formed over and in contact with the electrode material 104. The electrically insulative material 102, the electrode material 104, the dielectric material 106 may be formed by conventional techniques, which are not described in detail herein.

For example, the electrically insulative material 102 may be fanned from a dielectric material such as silicon dioxide ("SiO$_2$"). In some embodiments, the electrically insulative material 102 may be deposited over a substrate (not shown) by conventional techniques, which are not described in detail herein. By way of non-limiting example, the electrode material 104 may be formed from a semiconductive material or a conductive material, such as doped polysilicon material. The electrode material 104 may be deposited over the electrically insulative material 102 by conventional techniques such as, for example, by CVD. The dielectric material 106 may be an oxide material, a nitride material or a polysilicon material. In one embodiment, the dielectric material 106 is silicon dioxide. The dielectric material 106 may be deposited over the electrode material 104 by conventional techniques, which are not described in detail herein.

As shown in FIG. 9, the recess 108 is defined by a surface 110 of the electrically insulative material 102 and sidewalls 112 including opposing, exposed vertical regions of the dielectric material 106 and the electrode material 104. For the sake of clarity, the semiconductor structure 100 depicted in the following drawings includes one recess 108. In other embodiments, a plurality of recesses (not shown) may be formed in the semiconductor structure 100. To form the recess 108, a portion of each of the dielectric material 106 and the electrode material 104 may be removed using conventional techniques. For example, portions of the dielectric material 106 and the electrode material 104 may be removed selective to a mask material (not shown) using a single etch chemistry, or separate etch chemistries. The etch chemistries may be selected by a person of ordinary skill in the art based on the materials used as the dielectric material 106 and the electrode material 104. By way of non-limiting example, if the dielectric material 106 is silicon dioxide, a suitable dry (i.e., plasma) etching process using, for example, tetrafluoromethane or trifluoromethane, may be employed to remove a portion of the dielectric material 106 selective to the mask material. The electrode material 104 may be selectively removed using the underlying electrically insulative material 102 as an etch stop. If the electrode material 104 is a doped polysilicon and the electrically insulative material 102 is silicon dioxide, a hot phosphoric acid etch may be used to remove a portion of the electrode material 104 without substantially removing the underlying electrically insulative material 102.

Figure 10:
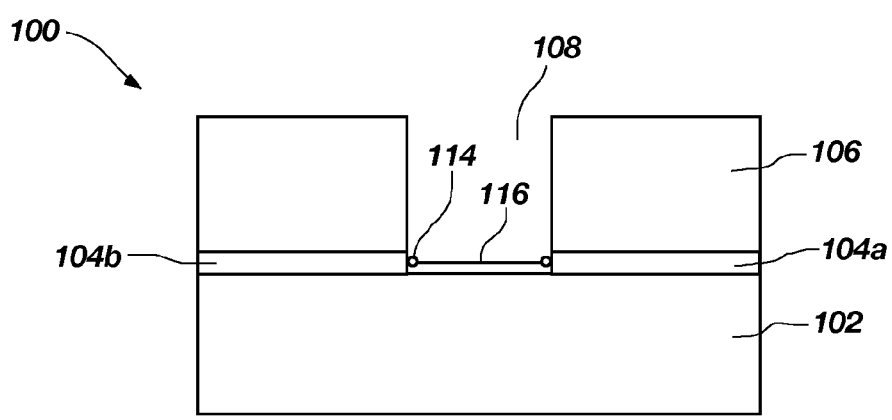

As shown in FIG. 10, a catalyst 114 may be deposited on the exposed vertical regions of the electrode material 104 and at least one nanotube may be formed thereon using conventional techniques, such as those described above. Conventional techniques of forming carbon nanotubes may result in the formation of a mixture of carbon nanotubes with metallic-type properties, which are referred to herein as "metallic nanotubes," and carbon nanotubes with semiconducting-type properties, which are referred to herein as "semiconducting nanotubes." The metallic nanotubes may be removed or damaged using conventional techniques, such as selective etching using a hydrogen or methane plasma, electrical breakdown or microwave heating. By way of non-limiting example, a sufficient current may be passed through the nanotubes to selectively damage or destroy the metallic nanotubes, while preserving the semiconducting nanotubes.

After substantially removing the metallic nanotubes, at least one semiconducting nanotube 116 may remain. For the sake of clarity, the semiconductor structure 100 depicted in the following drawings includes a single semiconducting nanotube 116. In other embodiments, a plurality of semiconducting nanotubes 116 may be formed in the semiconductor structure 100. The remaining semiconducting nanotubes 116 may electrically couple the exposed regions of the electrode material 104. The electrode material 104 may function as source and drain regions 104a and 104b of the semiconductor structure 100.

Figure 11:
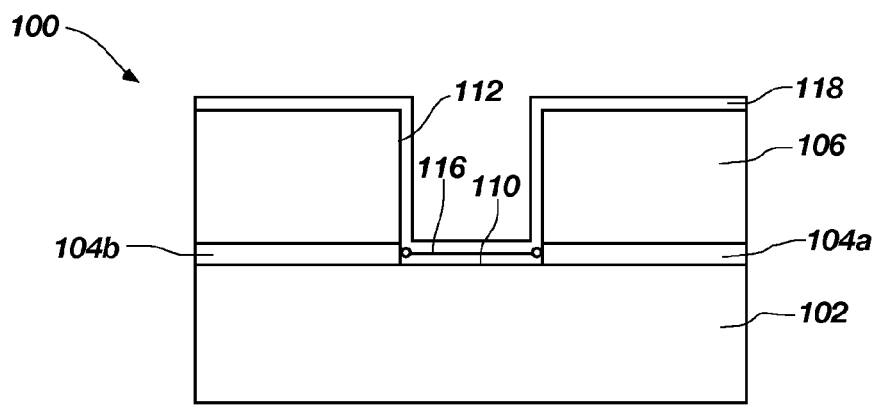

Referring to FIG. 11, a gate dielectric 118 may be conformally formed over and in contact with the dielectric material 106, the sidewalls 112 of the dielectric material 106 and the source and drain regions 104a and 104b, and the surface 110 of the electrically insulative material 102. The gate dielectric 118 may be deposited over or may encase or surround the semiconducting nanotubes 116. By way of non-limiting example, the gate dielectric 118 may be silicon dioxide or a high-k material. Conventional methods including, but not limited to, PVD and CVD, may be used to deposit the gate dielectric 118.

Figure 12:
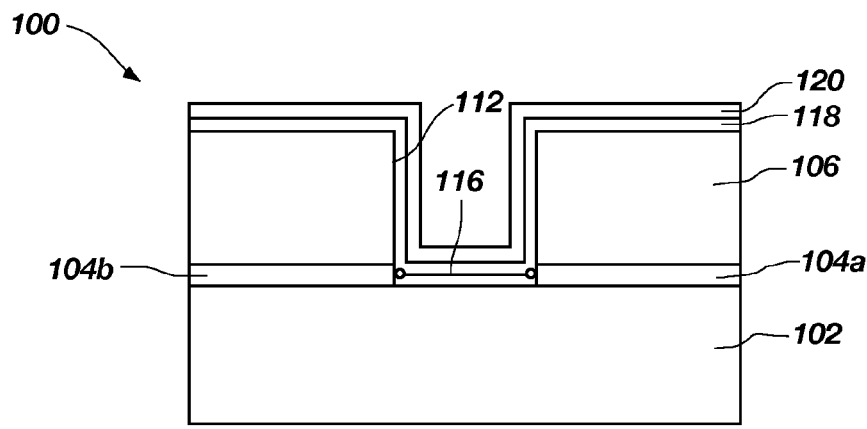

As depicted in FIG. 12, a conductive material 120 may be conformally formed over and in contact with the gate dielectric 118. The conductive material 120 may be a metal such as tungsten, titanium, tantalum, aluminum, platinum, gold, silver, copper, or combinations thereof. The conductive material 120 may be deposited over the gate dielectric 118 and dielectric material 106 by conventional techniques such as, for example, electroless deposition, PVD, and CVD. The conductive material 120 is isolated from the semiconducting nanotubes 116 by the gate dielectric 118.

Figure 13:
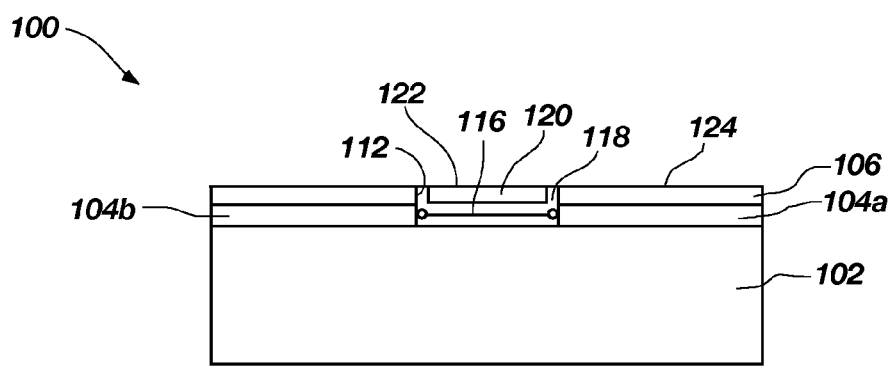

FIG. 13 shows the semiconductor structure 100 after removal of a portion of the conductive material 120, the gate dielectric 118, and the dielectric material 106 to form a gate 122. The materials may be removed to render an upper surface 124 of the semiconductor structure 100 substantially planar. For example, conventional planarization techniques may be used to form the gate 122 including the gate dielectric 118 disposed over the semiconducting nanotubes 116 and lining the remaining portions of the sidewalls 112 and the conductive material 120 disposed over the gate dielectric 118. The semiconducting nanotubes 116 remain electrically connected to the source and drain regions 104a and 104b and may function as a current carrying device or channel.

The semiconductor structure 100 may function as a control gate in which the semiconducting nanotubes 116 function as a semiconducting channel between the source and drain regions 104a and 104b. The semiconducting channel may include a plurality of semiconducting nanotubes 116 or, alternatively, a single nanotube. By applying a current to the gate 122, the semiconducting nanotubes 116 can be switched from a conducting to an insulating state. When an appropriate voltage is applied to the gate 122, the semiconducting nanotubes 116 may function as a channel that passes a current between the source and drain regions 104a and 104b.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A method of fabricating a semiconductor structure, comprising:
   removing portions of a dielectric material and an electrode material overlying an electrically insulative material to form a source and a drain;
   forming a catalyst material on a sidewall of the source and on an opposing sidewall of the drain;
   forming at least one semiconducting carbon nanotube extending from a particle of the catalyst material on the sidewall of the source to another particle of the catalyst material on the opposing sidewall of the drain, the at least one semiconducting carbon nanotube physically contacting the particle of the catalyst material and the another particle of the catalyst material;
   forming a gate dielectric over the at least one semiconducting carbon nanotube; and
   forming a conductive material over the gate dielectric.

2. The method of claim 1, further comprising removing a portion of the dielectric material, the gate dielectric, and the conductive material to render an upper surface of the semiconductor structure substantially planar.

3. The method of claim 1, wherein the removing portions of the dielectric material and the electrode material overlying the electrically insulative material comprises forming a recess defined by sidewalls of the dielectric material and the electrode material and a surface of the electrically insulative material.

4. The method of claim 1, wherein the forming at least one semiconducting carbon nanotube comprises removing metallic nanotubes from a plurality of carbon nanotubes using at least one of selective etching, electrical breakdown or microwave heating.

5. The method of claim 1, wherein the forming at least one semiconducting carbon nanotube comprises forming a plurality of semiconducting carbon nanotubes electrically connecting the source and the drain.

6. The method of claim 1, wherein the forming the gate dielectric over the at least one semiconducting carbon nanotube comprises surrounding the at least one semiconducting carbon nanotube with the dielectric material.

7. The method of claim 1, wherein the forming at least one semiconducting carbon nanotube comprises embedding a terminal end of the at least one semiconducting carbon nanotube in a portion of the catalyst material on the sidewall of the source, and embedding another terminal end of the at least one semiconducting carbon in another portion of the catalyst material on the opposing sidewall of the drain.

8. A semiconductor device, comprising:
   a source and a drain;
   a catalyst material on a sidewall of the source and on an opposing sidewall of the drain;
   at least one semiconducting carbon nanotube extending from a particle of the catalyst material on the sidewall of the source to another particle of the catalyst material on the opposing sidewall of the drain, the at least one semiconducting carbon nanotube physically contacting the particle of the catalyst material and the another particle of the catalyst material;
   a gate dielectric disposed over the at least one semiconducting carbon nanotube; and
   a conductive material overlying a portion of the gate dielectric.

9. The semiconductor device of claim 8, wherein the at least one semiconducting carbon nanotube is configured to control current flow between the source and the drain.

10. The semiconductor device of claim 8, wherein the gate dielectric surrounds the at least one semiconducting carbon nanotube.

11. The semiconductor device of claim 8, wherein each of the source and the drain comprises a doped polysilicon material.

12. The semiconductor device of claim 8, wherein the catalyst material is substantially continuous on the sidewall of the source and on the opposing sidewall of the drain.

13. The semiconductor device of claim 8, wherein the catalyst material is discontinuous on the sidewall of the source and on the opposing sidewall of the drain.

14. The semiconductor device of claim 8, wherein the catalyst material is selected from the group consisting of platinum, palladium, copper, vanadium, molybdenum, zinc, an oxide of a transition metal, combinations thereof, and alloys thereof.

15. The semiconductor device of claim 8, wherein the at least one semiconducting carbon nanotube consists of a single nanotube.

16. The semiconductor device of claim 8, further comprising a dielectric material over the source and the drain and adjacent to the gate dielectric.

17. The semiconductor device of claim 16, wherein upper surfaces of the dielectric material, the gate dielectric, and the conductive material are substantially coplanar.

* * * * *